US 6,697,275 B1

(12) United States Patent
Sywyk et al.

(10) Patent No.: US 6,697,275 B1
(45) Date of Patent: Feb. 24, 2004

(54) METHOD AND APPARATUS FOR CONTENT ADDRESSABLE MEMORY TEST MODE

(75) Inventors: Stefan P. Sywyk, San Jose, CA (US); Eric H. Voelkel, Ben Lomond, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 52 days.

(21) Appl. No.: 10/026,141

(22) Filed: Dec. 18, 2001

(51) Int. Cl.[7] .............................................. G11C 15/00
(52) U.S. Cl. ................ 365/49; 365/189.02; 365/189.07; 365/230.02
(58) Field of Search ............................ 365/49, 189.07, 365/189.02, 230.02

(56) References Cited

U.S. PATENT DOCUMENTS 6,166,939 A * 12/2000 Nataraj et al. ................ 365/49
6,266,262 B1 * 7/2001 Washburn et al. ............. 365/49
6,324,087 B1 * 11/2001 Pereira ........................ 365/49

* cited by examiner

Primary Examiner—Richard Elms
Assistant Examiner—Pho M. Luu
(74) Attorney, Agent, or Firm—Bradley T. Sako (57) ABSTRACT

A content addressable memory (CAM) (100) can include a number of CAM entries (102-0 to 102-n). Match indications from CAM entries (102-0 to 102-n) and mismatch indications from complementing circuits (106-0 and 106-n) can be supplied to a switching circuit (108). Mismatch indications can indicate if an entry mismatches data when compared with a comparand (104). In one mode of operation, a switching circuit (108) can provide match indications on a number of switch outputs (SW0 to SWn). In another mode of operation, switching circuit (108) can provide mismatch indications on a number of switch outputs (SW0 to SWn).

22 Claims, 4 Drawing Sheets

| FIND_MISS | FIND_MATCH | PE |
|---|---|---|
| 0 | 0 | 0 |
| 0 | 1 | MATCHL |
| 1 | 0 | MISSL |
| 1 | 1 | 1 |

| ENTRY# | ENTRY DATA | PEy(c0) | PEy(c2) |
|---|---|---|---|
| 000 | DATA A | 1 | 0 |
| 001 | DATA A | 1 | 0 |
| 010 | DATA A | 1 | 0 |
| 011 | DATA B | 0 | 1 |
| 100 | DATA A | 1 | 0 |
| 101 | DATA A | 1 | 0 |
| 110 | DATA C | 0 | 1 |
| 111 | DATA A | 1 | 0 |

METHOD AND APPARATUS FOR CONTENT ADDRESSABLE MEMORY TEST MODE

TECHNICAL FIELD

The present invention relates generally to content addressable memories (CAMs) and more particularly to test modes and test methods for CAMs.

BACKGROUND OF THE INVENTION

Due to the increasing importance of data networks, including the Internet, applications for content addressable memories (CAMs) have continued to proliferate. CAMs, also sometimes referred to as "associative memories," can provide rapid matching functions that are often needed in certain packet processing hardware devices, such as routers and network switches, to name just two. In a typical packet processing operation, a device can receive a data packet. The packet can include a "header" that includes various data fields that indicate how the packet should be processed. The device can use a matching function, provided by a CAM, to compare one or more header fields to "look-up" tables stored in the CAMs.

A typical CAM can store the data values of a look-up table in one or more CAM cell arrays. CAM cell arrays can be configured into a number of entries, each of which can provide a match indication. In a compare (i.e., match) operation, data values stored within CAM entries can be compared to a comparand value (also referred to as a "search key"). In a typical packet processing device, the comparand value can include a field extracted from a data packet header. If a data value matches an applied comparand value, the corresponding entry can generate an active match indication. If a data value does not match an applied comparand value, the corresponding entry can generate an inactive match indication (signifying a "mismatch") condition.

For many CAM applications it can be desirable to have entries arranged with a predetermined priority. In the event two or more match indications are activated in response to an applied comparand value, one of the match indications can be selected according to the priority of its corresponding entry.

Figure 6:
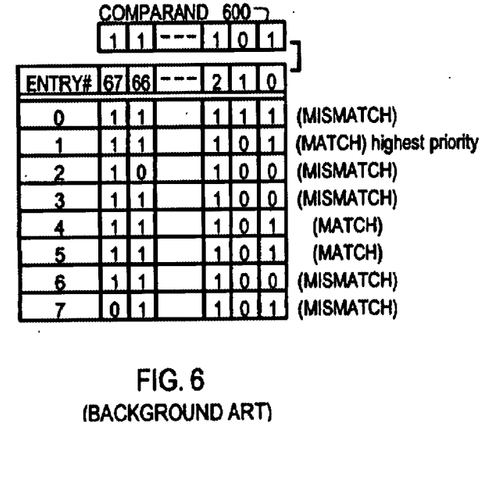
FIG. 6 is a diagram illustrating the operation of a conventional content addressable memory having a priority encoder.

Referring now to FIG. 6, a representation of a CAM having entries with multiple matches is depicted in table form. A CAM according to FIG. 6 may include eight entries, labeled 0 to 7. Also shown in FIG. 6 is a 68-bit comparand value 600. In this example, lower numbered entries can have priority over higher numbered entries. Thus, if the application of a comparand value resulted in entries 1, 4 and 5 activating a match indication, the match indication of entry 1 can have priority over that of entries 4 and 5.

Figure 7:
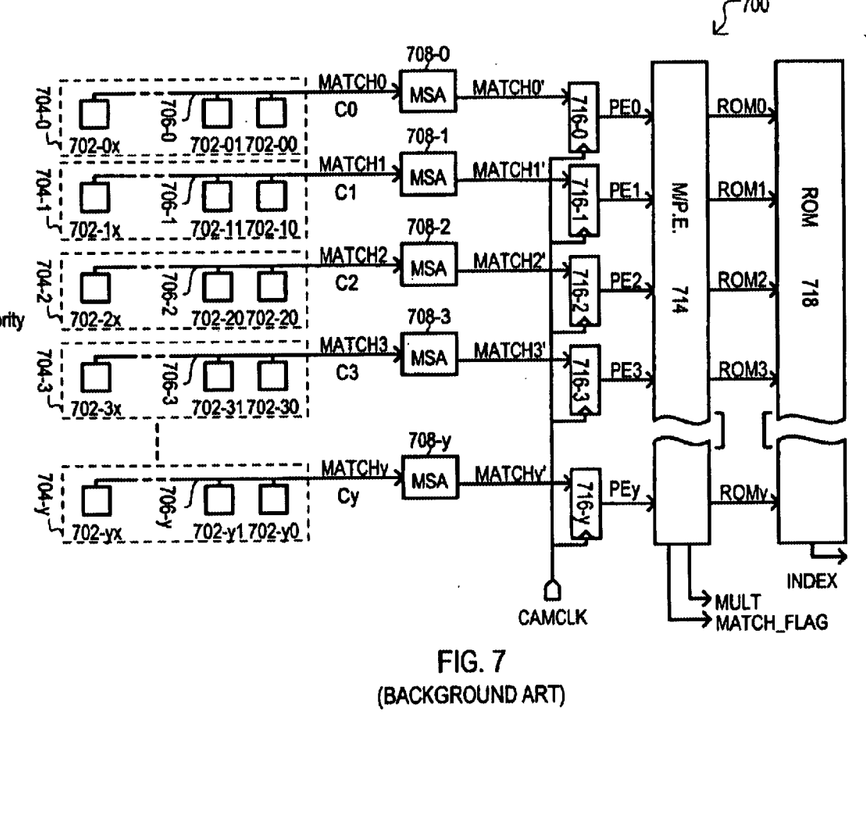
FIG. 7 is a block schematic diagram of a conventional content addressable memory having a priority encoder.

To better understand the structure of the CAM and the use of a priority encoder, a conventional approach is shown in FIG. 7 and is designated by the general reference character 700. Referring to FIG. 7, a CAM 700 may include CAM cells identified as 702-yx, where y indicates a particular row and x indicates a particular column. CAM cells of a same row can belong to the same entry 704-0 to 704-y. CAM cells of an entry 704 can store data for comparison with a comparand value. Each entry (704-0 to 704-y) may provide a match indication MATCH0–MATCHy after comparing a comparand to entry values.

Match indications MATCH0–MATCH-y can be generated on match lines 706-0 to 706-y, respectively. Match lines (MATCH0–MATCH-y) may then be amplified with a match line's respective match sense amplifier (MSA), designated by 708-0 to 708-y. Match sense amplifiers 708-0 to 708-y can produce output signals MATCH0' to MATCHy'. Resulting signals MATCH0' to MATCHy' can be buffered in registers 716-0 to 716-y. Subsequently, the registers 716-0 to 716-y may output signals PE0 to PEy that are used as inputs to a match/priority encoder (M/P.E.), designated by 714.

It is noted that a CAM 700 may also generate a match flag. A match flag may be activated when at least one entry generates a match indication. A match flag may be generated by a conventional circuit that logically combines all match outputs to determine the presence of at least one active match indication (e.g., a logical ORing of match indications). Such a match flag is shown in FIG. 7 MATCH_FLAG as an output from a M/P.E. 714 in FIG. 7. However, it is understood that a match circuit that generates a match flag (MATCH_FLAG) may be entirely separate from a priority encoder circuit.

A M/P.E. 714 may output values ROM0 to ROMy, which may generally be encoded values corresponding to a matching entry 704 with the highest priority. Such M/P.E. 714 output values (ROM0 to ROMy) may be applied to a read-only-memory (ROM) 718 to generate an index value INDEX.

A M/P.E. 714 may further include a multiple match detection circuit. Multiple match detection circuits may detect when more than one match indication is generated. In the particular example of FIG. 7, a multiple match detection circuit within a M/P.E. 714 may generate a multiple match signal (MULT) that is active when more than one match indication is generated.

For further details on the operation of particular priority encoders, one may reference U.S. Pat. No. 6,268,807 "Priority encoder/read only memory (ROM) combination" issued to Miller et al. on Feb. 1, 2000.

The conventional ROM approach of FIG. 7 generates an index value. Such a value may be conceptualized as "associated" data. That is, an associated data value may be generated corresponding to each CAM entry. However, associated data may take a variety of other forms. As but two of the many possible examples, associated data may be stored in memory cells connected directly or indirectly to a match line and/or indication. In addition, an index value itself may be applied to another circuit and/or device to generate additional associated data (e.g., a index may form all or a portion of a RAM device address).

Of course, a CAM may only generate match indications, and does not necessarily have to generate or otherwise point to associated data.

Testing memories devices, such as CAMs, can be an important step in a manufacturing process. Testing may detect process defects, enable device repair, and provide an indication of device reliability. Testing may occur on a device level and/or a "board" level (i.e., after a device has been packaged and installed). In the case of detecting process defects, devices may be tested in wafer-form and/or in a finished package.

A test on a semiconductor device may cycle through all of the entries to insure functionality of all the CAM cells. Once the defective CAM cells are identified, a device may be repaired with redundant memory. The test time and equipment needed to achieve a given material throughput can have a direct impact on the cost of manufacturing the device. Thus, reductions in test time and/or necessary test equipment can reduce manufacturing costs.

For a CAM with a priority encoder, a testing time can be compounded by the fact that a priority encoder typically outputs an encoded address of a first match location. As noted above, simultaneous matches lower in priority may go undetected. Therefore, when testing an entry, all entries higher in priority may be forced to a mismatch so that an entry of interest can be singled out as matching or mismatching—and hence tested.

Referring once again to FIG. 6, a first conventional testing of a priority encoded CAM will now be described. When targeting entry 4 for testing, all entries with higher priority (entries 0 to 3) may be forced to a mismatch with the comparand data. In this way, entry 4 may be examined to see if the entry is a match or mismatch. In this case, entry 1 may conventionally be rewritten with mismatching data before entry 4 is tested. Such a conventional approach of ensuring higher order mismatches can add to testing algorithm complexity and/or increased test time when testing a CAM with a priority encoder.

Another conventional testing method may provide a more efficient approach to testing CAM entries. Such a second conventional method may include writing different data values to each entry. Such different data values may then be applied to as comparand values to the CAM. In a "good" part, one match indication should be generated for each unique comparand value. This more efficient approach can still require multiple cycles and "n" comparand values will have to be applied for "n" entries. Further, provided each entry stores binary data, for entries of x bits, if there are more than $2^x$ entries on a CAM, unique values for each entry are not possible. Consequently, in such cases only portions of a CAM may be tested at one time using this approach.

In light of the above, it would be desirable to arrive at some way of testing a CAM that identifies mismatches or errors. Additionally, it would be desirable to have some means of verifying matches without having to sequence through highest to lowest priorities. It would also be advantageous to have a method to reduce test time and have reduced algorithm complexity when compared to conventional approaches.

SUMMARY OF THE INVENTION

According to disclosed embodiments, a content addressable memory (CAM) may includes a number of entries that can store data values. In response to an applied comparand value, each entry can generate a match indication. Match indications can be received by a switch circuit. Each entry can further generate a mismatch indication in response to an applied comparand value. Mismatch indications can also be received by a switch circuit. A switch circuit may selectively output match indications or mismatch indications.

According to one aspect of the embodiments, match indications and mismatch indications from the CAM cells can be applied to the same priority encoder.

According to another aspect of the embodiments, in response to match indications, a priority encoder can generate a highest priority match indication. In response to mismatch indications, a priority encoder can generate a highest priority mismatch indication.

According to another aspect, a switch circuit can include multiplexer circuits.

According to another aspect of the embodiments a switch circuit may output match indications in a first mode, mismatch indications in a second mode, and predetermined logic states in a third mode.

According to another aspect of the embodiments, a CAM may include a match detection circuit that can receive match indications or mismatch indications. A match detection circuit can provide a flag. A flag can indicate that at least one match indication is active in one mode, or at least one mismatch indication is active in another mode.

DETAILED DESCRIPTION OF THE EMBODIMENTS

Figure 1:
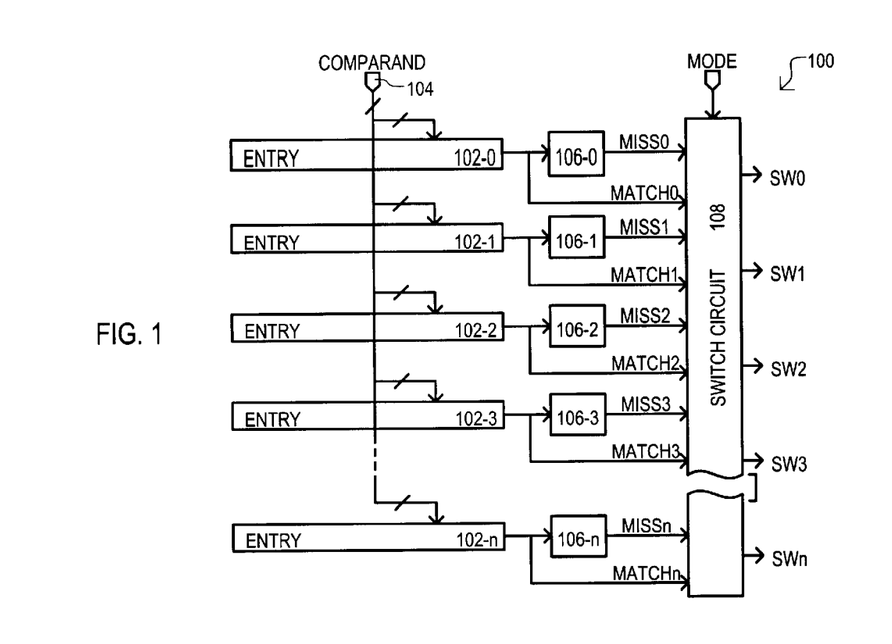
FIG. 1 is a block schematic diagram of a first embodiment.

Various embodiments will now be discussed in conjunction with a number of figures. Referring now to FIG. 1, a content addressable memory (CAM) according to a first embodiment is set forth in a block schematic diagram and designated by the general reference character 100. A first embodiment 100 may include a number of CAM entries shown as 102-0 to 102-n.

Each CAM entry (102-0 to 102-n) can store a data value that may be compared to a comparand value. In response to such a compare operation, each CAM entry (102-0 to 102-n) can provide a match indication (MATCH0–MATCHn). A match indication can indicate if a stored data value matches or does not match an applied comparand value. A CAM entry (102-0 to 102-n) can receive an applied comparand value by way of a comparand bus 104.

A first embodiment 100 may further include complementing circuits 106-0 to 106-n that can be associated with match indications MATCH0 to MATCHn, respectively. Each complementing circuit (106-0 to 106-n) can output a complement of a match (or mismatch) indication for an associated entry via signals MISS0 to MISSn, respectively.

As shown in FIG. 1, a first embodiment 100 may further include a switching circuit 108. A switching circuit 108 can receive match indications (MATCH0–MATCHn) and mismatch indications (MISS0 to MISSn) from entries 102-0 to 102-n. In addition, a switching circuit 108 may also receive mode information, shown as MODE. MODE information can place switching circuit 108 into a number of different modes, including at least a find match mode and a find mismatch mode.

In a find match mode, a switching circuit 108 can provide match indications MATCH0–MATCHn on switch outputs SW0–SWn, respectively. Thus, a find match mode can provide active match indications for those entries that may match a comparand value. However, in a find mismatch mode, switching circuit 108 can provide mismatch indications MISS0–MISSSn to the switch outputs (SW0–SWn). Thus, in a find mismatch mode, a CAM may compare entries for mismatches rather than matches. That is, a switch output (SW0–SWn) can be active when an entry does not match an applied comparand value.

In this way, the first embodiment 100 can include a number of output nodes (such as switch outputs SW0–SWn) that can provide match indications in one mode and mismatch indications in another mode.

Such an arrangement may allow for a test mode that may be faster and/or more easily executed than conventional approaches. In particular, entries (102-0 to 102-n) may all be programmed to a particular value. A matching value may then be applied as a comparand value. If matching circuits in entries (102-0 to 102-n) are functioning properly, mismatch indications (MISS0–MISSn) can all be inactive. However, if an entry (102-0 to 102-n) (and/or its associated circuitry) is defective, a mismatch indication can be activated. Such a mismatch indication can be inverted by a corresponding complementing circuit (106-0 to 106-n) to generate an active mismatch indication (MISS0–MISSn).

In this way, a defective entry (and/or its associated circuitry) may be rapidly detected with a test that can write a same data value to all entries. This is in contrast to conventional approaches that can include repeatedly writing a mismatching value to all lower priority entries.

Figure 2:
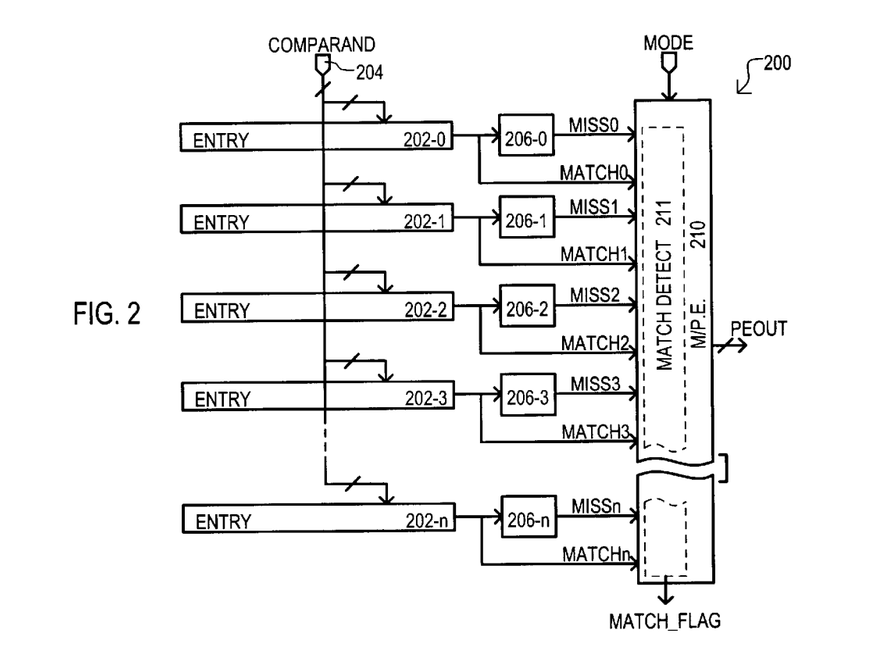
FIG. 2 is a block schematic diagram of a second embodiment.

Referring now to FIG. 2, a second embodiment is set forth in a block schematic diagram and designated by the general reference character 200. A second embodiment 200 can have many of the same constituents as the first embodiment 100. To that extent, like constituents will be referred to by the same reference character, but with the first character being a 2 instead of a 1. Thus, FIG. 2 includes entries 202-0 to 202-n, complementary circuits 206-0 to 206-n, and a comparand bus 204.

A second embodiment 200 may further include a match circuit/priority encoder 210. A match circuit/priority encoder 210 can receive match indications MATCH0–MATCHn from entries (202-0 to 202-n) and mismatch indications (MISS0–MISSn) from complementing circuits 206-0 to 206-n.

In the particular embodiment of FIG. 2, a match circuit/priority encoder 210 may include a match detection circuit 211. A match detection circuit 211 may receive match indications (MATCH0–MATCHn) or mismatch indications (MISS0–MISSn) and provide a flag (MATCH_FLAG). A flag (MATCH_FLAG) may provide different information according to a particular mode. For example, when a match detection circuit 211 receives match indications (MATCH0–MATCHn), a flag (MATCH_FLAG) can indicate that at least one match indication (MATCH0–MATCHn) is active. Similarly, when a match detection circuit 211 receives mismatch indications (MISS0–MISSn), a flag (MATCH_FLAG) can indicate that at least one mismatch indication (MISS0–MISSn) is active.

In particular embodiments, a match detection circuit 211 may logically combine match indications (MATCH0–MATCHn) or mismatch indications (MISS0–MISSn). Accordingly, in the particular example of FIG. 2, when a match detection circuit 211 receives one or more active match indications (MATCH0–MATCHn), a flag (MATCH_FLAG) may be activated. Similarly, when a match detection circuit 211 receives one or more active mismatch indications (MISS0–MISSn), a flag (MATCH_FLAG) may be activated.

A match circuit/priority encoder 210 can also provide a number of priority encoder outputs PEOUT. In the arrangement of FIG. 2, a match circuit/priority encoder 210 can prioritize match indications (MATCH0–MATCHn) as well as mismatch indications (MISS0–MISSn), depending upon a particular mode of operation.

As just one example, a match circuit/priority encoder 210 can provide a priority encoder output that corresponds to each match indication (MATCH0–MATCHn). If more than one of the match indications (MATCH0–MATCHn) is active, a match circuit/priority encoder 210 can activate one of the priority encoder outputs according to predetermined criteria, such as entry position in a CAM.

In addition, a match circuit/priority encoder 210 can also provide a priority encoder output that corresponds to each mismatch indication (MISS0–MISSn). If a mismatch indication (MISS0–MISSn) output from complementing circuits (206-0 to 206-n) indicates that more than one entry (202-0 to 202-n) contains a data mismatch, the match circuit/priority encoder 210 can activate one of the priority encoder outputs according to predetermined criteria, such as entry position in a CAM.

In this way, the second embodiment 200 can include a match circuit/priority encoder that indicates the presence of one or more match indications or mismatch indications, and determines priority among multiple active match indications, as well as among entries that have multiple mismatch indications. In one approach, such an operation may result in a fast test mode like that indicated above for a first embodiment.

In a test mode, all entries (202-0 to 202-n) may be written with a same data value. A comparand value that matches the written data value may then be applied. If all entries (202-0 to 202-n) are functioning properly, all mismatch indications (MISS0–MISSn) may be inactive. However, if an entry (202-0 to 202-n) (and/or its associated circuitry) is defective, a mismatch indication (MISS0–MISSn) can be activated. Such a mismatch indication may be detected by a match circuit/priority encoder 210, thus indicating a defect in a device. As but one very particular example, in a test mode, mismatch indications (MISS0–MISSn) may be applied to a match detection circuit 211. If any of the mismatch indications (MISS0–MISSn) is active, a flag (MATCH_FLAG) may be set—thereby indicating that at least one entry is defective.

Figure 3:
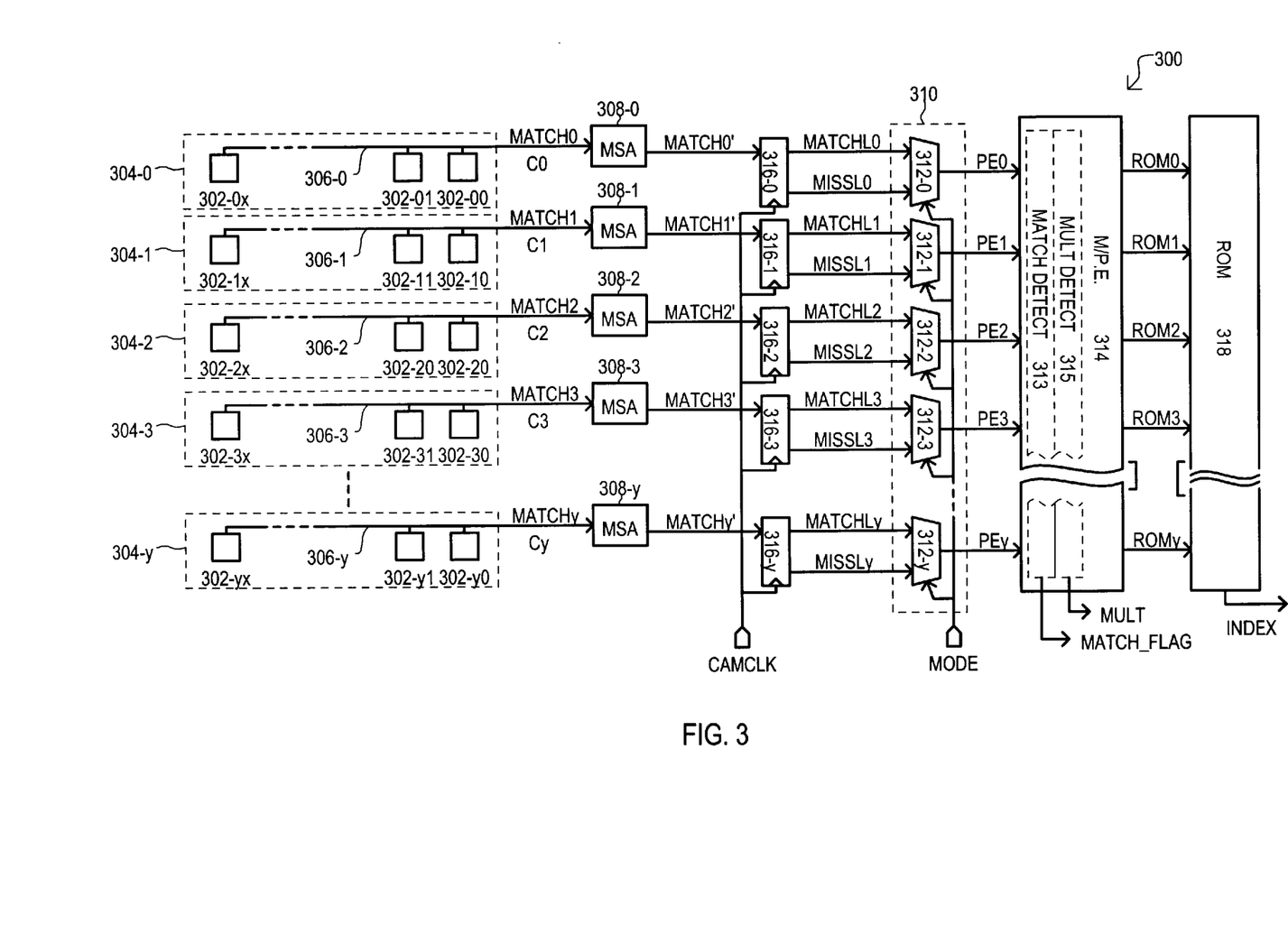
FIG. 3 is a schematic diagram of a third embodiment.

Referring now to FIG. 3, a third embodiment is set forth in a schematic diagram and designated by the general reference character 300. A third embodiment 300 may include a number of CAM cells identified as 302-yx, where y can indicate a particular row and x can indicate a particular column. In the particular arrangement of FIG. 3, CAM cells of a same row can belong to the same entry 304-0 to 304-y. Each entry (304-0 to 304-y) can provide a match indication MATCH0–MATCHy. The CAM cells of an entry (304-0 to 304-y) can store data for comparison with a comparand value.

Match indications MATCH0–MATCHy can be generated on match lines 306-0 to 306-y, respectively. In one particular arrangement, a match line (306-0 to 306-y) may be precharged (or predischarged) to one potential. In the event an applied comparand value matches the data values stored in an entry (304-0 to 304-y) the match line of the entry can remain precharged (or predischarged). However, if data in any of the CAM cells of an entry (304-0 to 304-y) does not match an applied comparand value, a match line of the entry can begin to discharge (or charge). Bits of a comparand value can be applied by way of comparand lines (not shown) that can be commonly coupled to CAM cells of a same column.

Each match line (306-0 to 306-y) can be connected to a match sense amplifier (308-0 to 308-y). A match sense amplifier (308-0 to 308-y) can detect a voltage and/or current change on its corresponding match line, and generate a match indication output (MATCH0'–MATCHy').

In the arrangement of FIG. 3, a third embodiment can also include register circuits (316-0 to 316-y) that can receive a match indication outputs (MATCH0'–MATCHy'). Register circuits (316-0 to 316-y) can latch match indication outputs (MATCH0'–MATCHy') according to a clock signal CAM-CLK. Register circuits 316-0 to 316-y can output a latched match indications MATCHL0–MATCHLy and latched mismatch indications MISSL0–MISSLy.

A third embodiment may further include a mode multiplexer (MUX) circuit 310. A ode MUX circuit 310 can receive latched match indication outputs (MATCHL0–MATCHLy) as well as latched mismatch indications (MISSL0–MISSLy). A mode MUX circuit 310 may provide a number of MUX outputs, shown as PE0–PEy. MUX outputs (PE0–PEy) may vary according to a particular mode of operation. For example, in a match operation, MUX outputs (PE0–PEy) can correspond to match indications (MATCHL0–MATCHLy). However, in a test operation, MUX outputs (PE0–PEy) can correspond to mismatch indications (MISSL0–MISSLy).

The particular mode MUX circuit 310 of FIG. 3 includes a number of MUXs, shown as items 312-0 to 312-y. MUXs (312-0 to 312-y) may each receive at least two inputs. One input of each MUX can receive a match indication (MATCHL0–MATCHLy), while another input of each MUX can receive a mismatch indication (MISSL0–MISSLy). MUXs (312-0 to 312-y) can be commonly controlled by a mode signal MODE.

When the MODE signal has a first value, each MUX (312-0 to 312-y) can provide a match indication (MATCHL0–MATCHLy) as a MUX output. In particular, match indications MATCHL0 to MATCHLy can be provided as MUX outputs PE0 to PEy, respectively.

When the MODE signal has a second value, each MUX (312-0 to 312-y) can provide a mismatch indication (MISSL0–MISSLy) as a MUX output. In particular, mismatch indications MISSL0 to MISSLy can be provided as MUX outputs PE0 to PEy, respectively.

In a third embodiment, MUX outputs (PE0 to PEy) can be received by a match circuit/priority encoder 314. In the particular example of FIG. 3, a match circuit/priority encoder 314 may include a match detect circuit 313 and a multiple match detect circuit 315.

A match detect circuit 313 may receive MUX outputs (PE0 to PEy) and determine when one or more of such inputs is active. Thus, when a MODE signal has a first value, a match detect circuit 313 may provide a flag (MATCH_FLAG) that indicates the presence of one or more active match indications (MATCHL0–MATCHLy). In addition, when a MODE signal has a second value, a match detect circuit 313 may provide a flag (MATCH_FLAG) that indicates the presence of one or more active mismatch indications (MISSL0–MISSLy).

A multiple match detect circuit 315 may receive MUX outputs (PE0 to PEy) and determine when more than one of such inputs is active. Thus, when a MODE signal has a first value, a multiple match detect circuit 315 may provide a multiple match flag (MULT) that indicates the presence of more than one active match indication (MATCHL0–MATCHLy). In addition, when a MODE signal has a second value, a multiple match detect circuit 315 may provide a multiple match flag (MULT) that indicates the presence of more than one active mismatch indication (MISSL0–MISSLy).

It is understood that while a match detect circuit 313 and multiple match detect circuit 315 are shown as separate entities in FIG. 3, such circuits may be integrated together. Along these same lines, while match and multiple match detect circuits (313 and 315) are shown as portions of a match circuit/priority encoder 314, such circuits may be separate from a priority encoder.

A match circuit/priority encoder 314 may also prioritize those values that are active according to predetermined criteria. Such predetermined criteria may include, but are not limited to, entry location.

As shown in FIG. 3, an output from a match circuit/priority encoder 314 (ROM0 to ROMy) may be provided to a read-only-memory (ROM) 318. A ROM 318 may generate an index value INDEX that corresponds to a prioritized input value ROM0 to ROMy.

According to a third embodiment, a particular mode of operation may result in a MODE signal having a particular value. More particularly, a MODE signal may have a first value in a find match mode, and a have a second value in a find mismatch mode. Thus, in a find match mode, a match circuit/priority encoder 314 can set a match flag (MATCH_FLAG) if a match exists, set a multiple match flag (MULT) if more than one match exists, and activate a priority encoder output (ROM0 to ROMy) corresponding to a highest priority entry having an active match indication output. In addition, in a find mismatch mode, a match circuit/priority encoder 314 can set a match flag (MATCH_FLAG) if a mismatch exists, set a multiple match flag (MULT) if more than one mismatch exists, and activate a priority encoder output (ROM0 to ROMy) corresponding to a highest priority entry having an active mismatch indication. Thus, a first mismatch may be determined. This mismatch may indicate an error.

In this way, a third embodiment 300 can include a multiplexer circuit 310 that can provide match indications in one mode and mismatch indications in another mode. Additionally, the third embodiment may provide a match and/or multiple match flag in one mode, and mismatch and/or multiple mismatch flag in another mode.

Yet further, a third embodiment 300 may prioritize entries having multiple match indications or prioritize entries having multiple mismatch indications with a priority encoder. Still further, a third embodiment 300 can include a read-only memory (ROM) that provides an index output value in response to a priority encoder's output of the prioritized indications (which may be match indications or mismatch indications).

Figure 4A:
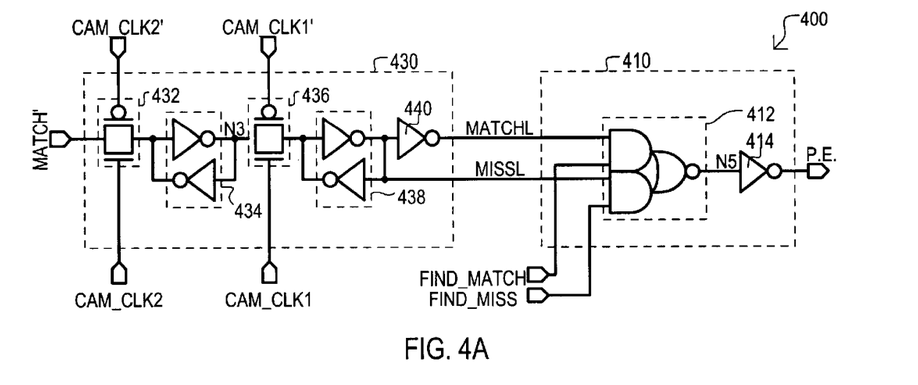
FIG. 4A is a schematic diagram of a register circuit and multiplexer (MUX) according to an embodiment.

Referring now to FIG. 4A, a register circuit and multiplexer are set forth that may be included in an embodiment of the present invention. A circuit is designated by the general reference character 400 and may include a register 430 and' a MUX 410. A register 430 may correspond to a third embodiment register 316-0 to 316-y. A MUX 410 may correspond to a third embodiment MUX (312-0 to 312-y).

A register 430 can generate a latched match and mismatch indications. A register 430 may receive an input signal MATCH', and provide an output signal MISSL and a complementary output signal MATCHL. A register 430 may be controlled by input signals CAM_CLK1 (and its inverse CAM_CLK1') and CAM_CLK2 (and its inverse CAM_CLK2'). Such input signals can control transmission circuits 436 and 432, respectively.

Upon activating a signal CAM_CLK2 (CAM_CLK2'), a transmission circuit 432 can be enabled, and an input value MATCH' can be stored in data latch 434. Data latch 434 may store a complementary value of MATCH' on node N3. On a subsequent activation of signal CAM_CLK1 (CAM_CLK1'), a transmission circuit 436 may be enabled and pass stored data from node N3 to data latch 438. Data latch 438 may thus store a complementary N3 value. This value may be output as signal MISSL. Complementing circuit 440 may generate a signal MATCHL from signal MISSL. Thus, two indication signals may be generated: MATCHL representing a match indication and MISSL representing a mismatch indication.

A multiplexer circuit MUX 410 may take various forms. In the particular example of FIG. 4A, a MUX 410 may include an And-Or-Invert circuit 412. FIG. 4 also shows a complementing circuit 414. It is understood that the inclusion of complementing circuit 414 may simplify the circuit logic description by logically equating the multiplexer circuit to a simple multiplexer or transmission gate. A MUX 410 may have two mode inputs, FIND_MATCH and FIND_MISS. Mode inputs (FIND_MATCH and FIND_MISS) can determine the mode of operation of the MUX 410. The first AND inputs of the And-Or-Invert circuit 412 can receive the control signal FIND_MATCH and the match indication output MATCHL. The second AND inputs of the And-Or-Invert circuit 412 can receive the control signal FIND_MISS and the mismatch indication output MISSL. The output signal of the And-Or-Invert circuit N5, may be inverted by complementary circuit 414 and be output as an output signal PE.

Figure 4B:
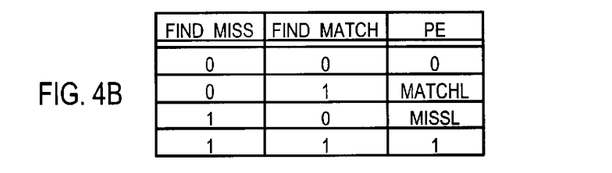
FIG. 4B is a logic table illustrating the various modes of operation for the MUX shown in FIG. 4A.

A truth table for the And-Or-Invert circuit 410 is shown in FIG. 4B. Referring now to FIG. 4B, a conventional match mode may be entered with FIND_MISS=0 and FIND_MATCH=1. Such a mode may essentially pass match indication MATCHL as output signal PE. A priority encoder may then prioritize match indications using output signal PE. The remaining combinations of input signals (FIND_MISS and FIND_MATCH) may be used as test modes.

A test mode that prioritizes a first mismatch (a find mismatch mode) may be entered with FIND_MISS=1 and FIND_MATCH=0. In this case, a mismatch indication MISSL may be passed as an output signal PE. A priority encoder may then prioritize a mismatch indication using output signal PE.

In this example, the remaining two logic states derived from FIND_MATCH and FIND_MISS, '00' and '11', may bring output signal PE to a '0' or '1' logic state, respectively. These latter test modes may be used to test various circuits that may follow a MUX 410 for defects by having inputs PE0 to PEy at a known data state (be it '0' or '1'). Such various circuits may include, but are not limited to, a match detection circuit, multiple match detection circuit, a priority encoder, or a ROM.

In this way, a fourth embodiment 400 can generate a match indication signal MATCHL and a mismatch indication signal MISSL. One of these indications may be selected according to the desired mode of operation. Additionally, a fourth embodiment 400 may allow for operational modes that can bring an output signal PE to a known '0' or to a known '1' logic state independent of the match or mismatch indications.

Figure 5A:
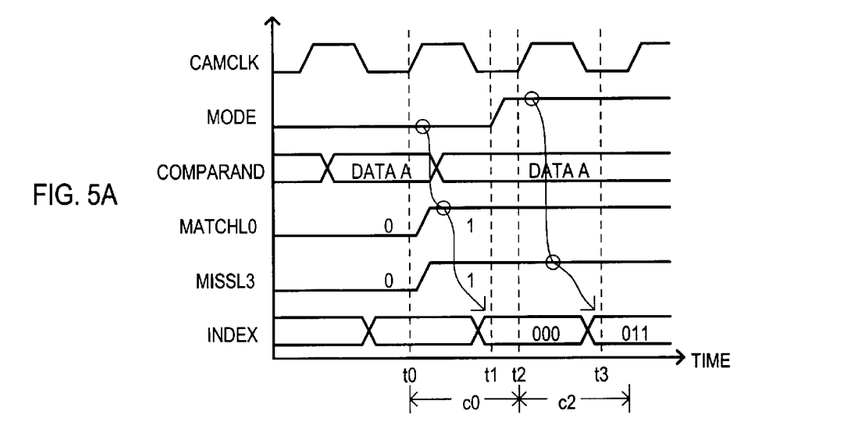
FIGS. 5A and 5B are diagrams illustrating find match and find mismatch operations of FIG. 3.

Having described various embodiments of the present invention, a find match and find mismatch operation according to a third embodiment 300 will now be described. Referring now to FIG. 5A, a timing diagram is set forth illustrating various signals and values of the third embodiment.

In particular, FIG. 5A shows a CAMCLK waveform that can be a timing signal for a third embodiment 300. A MODE signal, discussed in conjunction with FIG. 3, is also included. A COMPARAND waveform illustrates a data value that is to be compared with CAM entries. An INDEX value waveform illustrates a resulting INDEX value generated by a ROM 318 of a third embodiment 300. Four time indicators are shown in FIG. 5A, including a times t0, t1, t2, and t3.

Figure 5B:
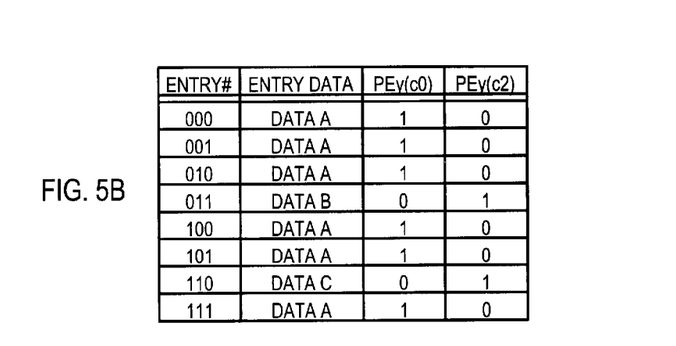

FIG. 5B sets forth an example of eight CAM entries of a third embodiment 300. FIG. 5B shows CAM entries at time t0, identifying a CAM entry number column and a data column. As an example of a testing operation, CAM entries may contain the same expected data DATAA. However CAM entry 011 is shown to contain erroneous DATAB and CAM entry 110 is shown to contain erroneous DATAC (instead of the expected DATAA). FIG. 5B also shows a priority encoder signal PEy's state for the cycle associated with t0 (denoted c0) and t2 (denoted c2) for this example.

Referring now to FIGS. 5A and 5B in conjunction with FIG. 3, different modes of operation of a third embodiment 300 will now be described. At time t0, the first eight entries of a CAM can include six entries that match the comparand data (entries 000, 001, 010, 100, 101, and 111) and two entries that mismatch the comparand data (entries 011 and 110). It is assumed that lower numbered entries have a higher priority. A MODE may be low signifying find match mode.

Those data values matching comparand data DATAA can be prioritized. For the arrangement of FIG. 5B, entries 000, 001, 010, 100, 101, and 111 are prioritized, resulting in a priority encoder output value corresponding to entry 000 being activated. An activated priority encoder output can be applied to ROM 318. In response, a ROM 318 can generate an index value corresponding to entry 000. In the particular example of FIGS. 5A and 5B, the resulting INDEX is the first matching address. Thus, at time t1, the INDEX value is "000."

It is noted that at this time a flag (MATCH_FLAG) may be set, indicating that at least one match indication is active. Further, in the event multiple match indications are active, a multiple match flag (MULT) may be activated.

At time t2, a MODE signal has transitioned high, beginning a test, or find mismatch mode. It is assumed that lower entries have a higher priority. In this mode, those data values mismatching comparand data DATA A can be prioritized. For the arrangement of FIG. 5B, entries 011 and 110 are prioritized, resulting in a priority encoder output value corresponding to entry 011 being activated. With such an output activated, a flag (MATCH_FLAG) may be set, indicating that at least one mismatch indication is active. Such a flag alone may indicate a defective part. Thus, such information may be used to debug, or dispense with a defective part. In addition, because multiple mismatch indications may be active, a multiple match flag (MULT) may also be set.

An activated priority encoder output can be applied to ROM 318. In response, ROM 318 can generate an index value corresponding to entry 011. In the particular example of FIGS. 5A and 5B, a resulting INDEX can be a first mismatching address. Thus, at time t3, the INDEX value is "011". In the case of a repair test, the INDEX value may be used to identify a CAM address for debug and/or repair. In the event a multiple match flag (MULT) is set, such information may indicate that further repair may be necessary.

In this way, mismatches or errors may be identified while under test. As another example of testing improvements, a common background data may be written to the entries under test. Providing that the desired entries have the same data (no errors in this case), a find mismatch mode may show that there are no mismatches. Test time may be reduced by testing and verifying desired entries in a single compare operation. This method compares favorably to a first conventional method that may add a write cycle with mismatch data following the compare cycle. In order for a particular entry to be tested with a conventional method, the entries having a higher priority than the entry being tested must contain mismatching data.

The method may also compare favorably to a second conventional test method that may write unique data to all entries and then apply such unique values as comparand values. Such an approach may require multiple cycles to apply the various unique comparand values.

Thus, a test according to the disclosed embodiments may be one comparison cycle for the new method verses 2n–1 cycles (one compare cycle and one write cycle), where n is the number of entries being tested, for the first conventional approach, or n compare cycles in the second conventional approach.

It is noted that an applied comparand value can be an "entire" comparand value, or a portion of a comparand value.

It is also noted that while the particular embodiment of FIG. 3 includes entries formed from a row of CAM cells, entries could include multiple such rows.

It is also understood that a match indication can include an exact match between all bits of a comparand value and those of a data value, or a "masked" match between the bits of a comparand value and corresponding unmasked portions of a masked data value. Likewise, a mismatch indication can be derived from all bits of a comparand value and those of a data value, or a "masked" mismatch between the bits of a comparand value and corresponding unmasked portions of a masked data value.

It is further understood that while the various examples have described encoders that determine priority according to entry order, other priority criteria may be used for match indications and/or mismatch indications. Further, a priority encoder may provide one type of priority for match indications and a different priority for mismatch indications.

It is also understood that while a And-Or-Invert circuit was shown as an example of one type of multiplexer in FIG. 4A, this is but one of many types of multiplexers (including circuits such as passgates and decoders) that can provide the match and mismatch indications to other circuits, such as a match detect circuit, multiple match detect circuit, and/or priority encoder, as but a few examples.

Similarly, while a register in FIG. 3 was shown to generate the two indication signals MATCHL and MISSL, the signal generation and multiplexing can be made at the match sense amplifier or in a logic chain leading up to other circuits, such as a match detect circuit, multiple match detect circuit, and/or priority encoder, as but a few examples.

Still further, it is understood that complementary matchline pairs may be used to generate the match and mismatch indication signals. On a related note, it is understood that a mismatch indication can be used to derive a match indication in a manner similar to what has been previously described.

Still further, it is understood that while a mode of operation has been described in which an entry's erroneous data has been used to generate a mismatch indicator, other operations could use mismatch information as well. These operations include identifying most recently used tags and identifying expired data tags for table updates to name but a few.

Yet further, it is understood that match indications and/or mismatch indications can be applied to other circuits (such as a match detect circuit, multiple match detect circuit, and/or priority encoder, as but a few examples) by various other intervening circuits.

Likewise, it is understood that mismatch indications can be used as inputs to complementing circuits to output match indications (instead of vice versa).

Still further, while some of the illustrated embodiments have shown the generation of an index value, the present invention may generate other types of associated data for a given match indication or mismatch indication.

Thus, while the preferred embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A content addressable memory (CAM), comprising:
   a plurality of entries that store data values for comparison to comparand values, each entry generating a match indication and mismatch indication in response to a comparison between a comparand value and a stored data value; and
   a switch circuit that couples match indications to switch outputs in one mode and couples mismatch indications to the switch outputs in another mode.

2. The CAM of claim 1, wherein:
   each entry includes a plurality of CAM cells.

3. The CAM of claim 2, wherein:
   the CAM cells of the same entry are commonly coupled to a match line that provides a match indication.

4. The CAM of claim 2, wherein:
   the CAM includes a plurality of CAM cells arranged into rows and columns, the CAM cells of the same entry being in the same row.

5. The CAM of claim 1, wherein:
   the switch circuit includes a multiplexer circuit.

6. The CAM of claim 5, wherein:
   the multiplexer circuit includes a plurality of multiplexers, each multiplexer having one input that receives a match indication of an entry and another input that receives a mismatch indication for the same entry.

7. The CAM of claim 1, wherein:
   the CAM includes a first mode; and
   the switch circuit couples mismatch indications to the switch outputs in the first mode.

8. The CAM of claim 1, further including:
   a priority encoder coupled to the switch outputs.

9. The CAM of claim 1, further including:
   a circuit that provides associated data corresponding to an entry when the match indication of the entry is active in the first mode, and provides associated data corresponding to an entry when the mismatch indication of the entry is active in the second mode.

10. A content addressable memory (CAM), comprising:
    a plurality of entries that store data values, each entry generating a match indication and a mismatch indication in response to a comparison between a comparand value and its data value; and a match circuit that generates a match flag, in a first mode the match flag indicating the activation of at least one match indication, in a second mode the match flag indicating the activation of at least one mismatch indication.

11. The CAM of claim 10, further including:

a priority encoder that prioritizes active match indications in the first mode and prioritizes active mismatch indications in the second mode.

12. The CAM of claim 10, wherein:

the data value stored in each entry can include a plurality of bits.

13. The CAM of claim 12, wherein:

each entry includes a plurality of CAM cells.

14. The CAM of claim 13, wherein:

the CAM cells function as ternary CAM cells.

15. The CAM of claim 13, wherein:

the CAM cells function as binary CAM cells.

16. The CAM of claim 10, further including:

a switch circuit disposed between the entries and the match circuit, the switch circuit switching match indications to the match circuit in the first mode and switching mismatch indications to the match circuit in the second mode.

17. The CAM of claim 16, further including:

the switch circuit providing a predetermined logic state to the match circuit in at least a third mode.

18. A method of operating a content addressable memory (CAM), comprising the steps of:

in a find match mode, comparing a comparand value to data values and generating a number of match indications, and applying the match indications to a switch circuit; and in a find mismatch mode, comparing a comparand value to data values and generating a number of mismatch indications, and applying the mismatch indications to the switch circuit.

19. The method of claim 18, further including:

in the find mismatch mode, prioritizing mismatch indications.

20. The method of claims 18, further including:

in the find match mode, prioritizing match indications.

21. The method of claims 18, further including:

in the find match mode, selectively outputting the match indications from a switch circuit; and in the find mismatch mode, selectively outputting mismatch indications from the switch circuit.

22. The method of claims 18, further including:

in the find match mode, providing associated data corresponding to a highest priority active match indication; and in the find mismatch mode, providing associated data corresponding to a highest priority active mismatch indication.

* * * * *